United States Patent [19]
Glick et al.

[11] Patent Number: 6,162,066
[45] Date of Patent: *Dec. 19, 2000

[54] SOCKET FOR POSITIONING AND INSTALLING AN INTEGRATED CIRCUIT CHIP ON A FLEXIBLE CONNECTOR SHEET

[75] Inventors: Michael Glick; Kenneth J. Mroczkiewicz, both of South Bend, Ind.

[73] Assignee: Wells-CTI, Inc., South Bend, Ind.

[ * ] Notice: This patent issued on a continued prosecution application filed under 37 CFR 1.53(d), and is subject to the twenty year patent term provisions of 35 U.S.C. 154(a)(2).

[21] Appl. No.: 08/857,239

[22] Filed: May 16, 1997

[51] Int. Cl.⁷ .................................................. H01R 12/00
[52] U.S. Cl. ............................................ 439/73; 439/331
[58] Field of Search .................................. 439/70, 71, 72, 439/73, 74, 330, 331; 324/754, 755, 756, 757, 758, 761, 762; 430/266

[56] References Cited

U.S. PATENT DOCUMENTS

| | | |
|---|---|---|
| 4,378,139 | 3/1983 | Griffin et al. . |
| 5,186,641 | 2/1993 | Uratsuji ................................... 439/266 |
| 5,273,441 | 12/1993 | Volz et al. . |
| 5,304,072 | 4/1994 | Kunioka et al. ......................... 439/266 |
| 5,320,550 | 6/1994 | Uratsuji et al. .......................... 439/266 |
| 5,387,118 | 2/1995 | Kishi et al. .............................. 439/266 |
| 5,409,392 | 4/1995 | Marks et al. ............................. 439/266 |
| 5,431,579 | 7/1995 | Kishi et al. .............................. 439/266 |
| 5,469,074 | 11/1995 | Drabenstadt et al. . |
| 5,493,237 | 2/1996 | Volz et al. . |
| 5,531,608 | 7/1996 | Abe . |
| 5,697,795 | 12/1997 | Abe ........................................... 439/73 |
| 5,718,595 | 2/1998 | Tohyama et al. ........................ 439/330 |
| 5,752,846 | 5/1998 | Abe ........................................ 439/266 |
| 5,816,828 | 10/1998 | Ikeya et al. ............................... 439/73 |
| 5,823,794 | 10/1998 | Abe ........................................... 439/73 |
| 5,833,471 | 11/1998 | Selna ........................................ 439/71 |

*Primary Examiner*—Paula Bradley
*Assistant Examiner*—Ross Gushi
*Attorney, Agent, or Firm*—Baker & Daniels

[57] ABSTRACT

A socket for positioning and installing an integrated circuit chip having terminals on one side thereof on a conductive elastomer includes a base which positions the chip over the elastomer. A camming member is moveable relative to the base between an open position disengaged from the chip and allowing the chip to be installed in the socket to a closed position in which the actuating member engages a side of the chip and exerts a force on the chip to embed the terminals in the elastomer to thereby provide an electrical connection between the terminals and the elastomer.

37 Claims, 13 Drawing Sheets

SOCKET FOR POSITIONING AND INSTALLING AN INTEGRATED CIRCUIT CHIP ON A FLEXIBLE CONNECTOR SHEET

This invention relates to a socket for positioning and installing an integrated circuit chip on a test board having a flexible connector sheet making electrical contact between the terminals on the integrated circuit chip and the test board.

Integrated circuit chips have become increasingly small in recent years, and may be small as 50 mm$^2$ or less and require terminals for effecting electrical connections with the chip that are extremely thin. One way of providing terminals at the required density is the so called ball grid array, or "BGA" terminals in which semi-spherical projections of alloy are provided in an array on one side of the integrated circuit chip. After manufacture, these chips must be tested to assure that they are not defective. This is accomplished by temporarily connecting the terminals of the chip to a test circuit board to permit testing to take place. The extremely dense terminal arrays necessary on state of the art integrated circuits make it difficult to effect connection of the terminal with the circuit test board in a way in which the same test board may be used repeatedly to test multiple chips. However, a flexible connector sheet, such as that shown in U.S. Pat. No. 5,500,280 (Yamazaki et al.) has recently become available. The flexible connector sheet comprises a sheet of a flexible elastomer in which multiple wire segments are embedded. Accordingly, a segment of the flexible elastomer connection sheet is mounted on a printed circuit board and the appropriate wire segments are connected to the conductors in the circuit board. The elastomer is reasonably flexible so that when a chip having a terminal array is pressed upon the connector sheet, the sheet deflects to enable the terminal balls of the array to make proper electrical contact with the wire segments. When a chip has been tested and removed from the connector sheet, the resiliency of the elastomer returns the connector sheet to its original state. The chip must installed in the proper position, and a reasonable force must be applied to the chip to push the terminals of the terminal array into the elastomer.

The present invention provides a test socket for positioning and installing an integrated circuit chip over a flexible connector sheet, and then installing the circuit on the connector sheet in the correct position, while assuring that the correct amount of force is exerted on the chip to properly embed the terminals in the elastomer, so that the terminals make proper electric contact with the appropriate wire segments. The socket includes a pair of levers with attached pressure pads that translate and rotate from an open position to a closed position in which the pressure pads, that are carried by the levers, engage the surface of the chip opposite the side bearing the terminal array.

These and other advantages of the present invention will become apparent from the following description, with reference to the accompanying drawings, in which.

Referring now to the drawings, a socket generally indicated by the numeral 10 is used to embed the terminals 14 of a ball grid terminal array (BGA) which is provided on one side 16 of the integrated circuit chip generally indicated by the numeral 18, into a connector sheet generally indicated by the numeral 20. The connector sheet 20 consists of a relatively soft elastomer in which parallel wire segments 22 are embedded at discrete intervals. The wire segments 22 extend between the top and bottom surfaces of the connecting sheet 20 at an angle as more fully described in the aforementioned U.S. Pat. No. 5,500,280. The connecting sheet 20 is mounted on a convention printed circuit (PC) board 24 and some or all of the wire segments 22 make contact with corresponding conductors of the PC board 24. Accordingly, an electrical connection between the integrated circuit chip 18 and the appropriate test equipment (not shown)is provided. The integrated circuit chip 18 has a surface 26 opposite the surface 16. The surface 26 is engaged, as will be hereinafter be described, by components of the socket 10 to install the integrated circuit chip 18 on the connector sheet 20 with the terminals 14 embedded in the sheet 20 in electrical contact at the appropriate wires 22.

The socket 10 includes a lower base plate generally indicated by the numeral 30 and an upper base plate generally indicated by the numeral 32. Lower base plate 30 defines a recess 34 which receives the connecting sheet 20, and also defines cavity 36 immediately above recess 34 which receives the integrated circuit chip 18. Projecting members 38, 39 project inwardly from the sides of the cavity 36 to engage the edges the chip 18 to precisely position the chip 18 with respect to the connecting sheet 20 when the latter is received in the recess 34. Lower base plate 30 further includes columns 40 at each corner thereof which define bores 42 therewithin. Each of the bores 42 receive a coiled spring 44. Opposite sides of the lower base plate 30 define raised columns 45 from which locating projections 46 extends. Columns 45 define half moons 48 and shoulders 50 at the lower edge of the columns 45. Columns 45 are connected to their adjacent columns 40 by walls defining outer sliding surfaces 52 and upper surfaces 54. The upper surfaces 54 are stepped down from the top of columns 45.

Figure 4:
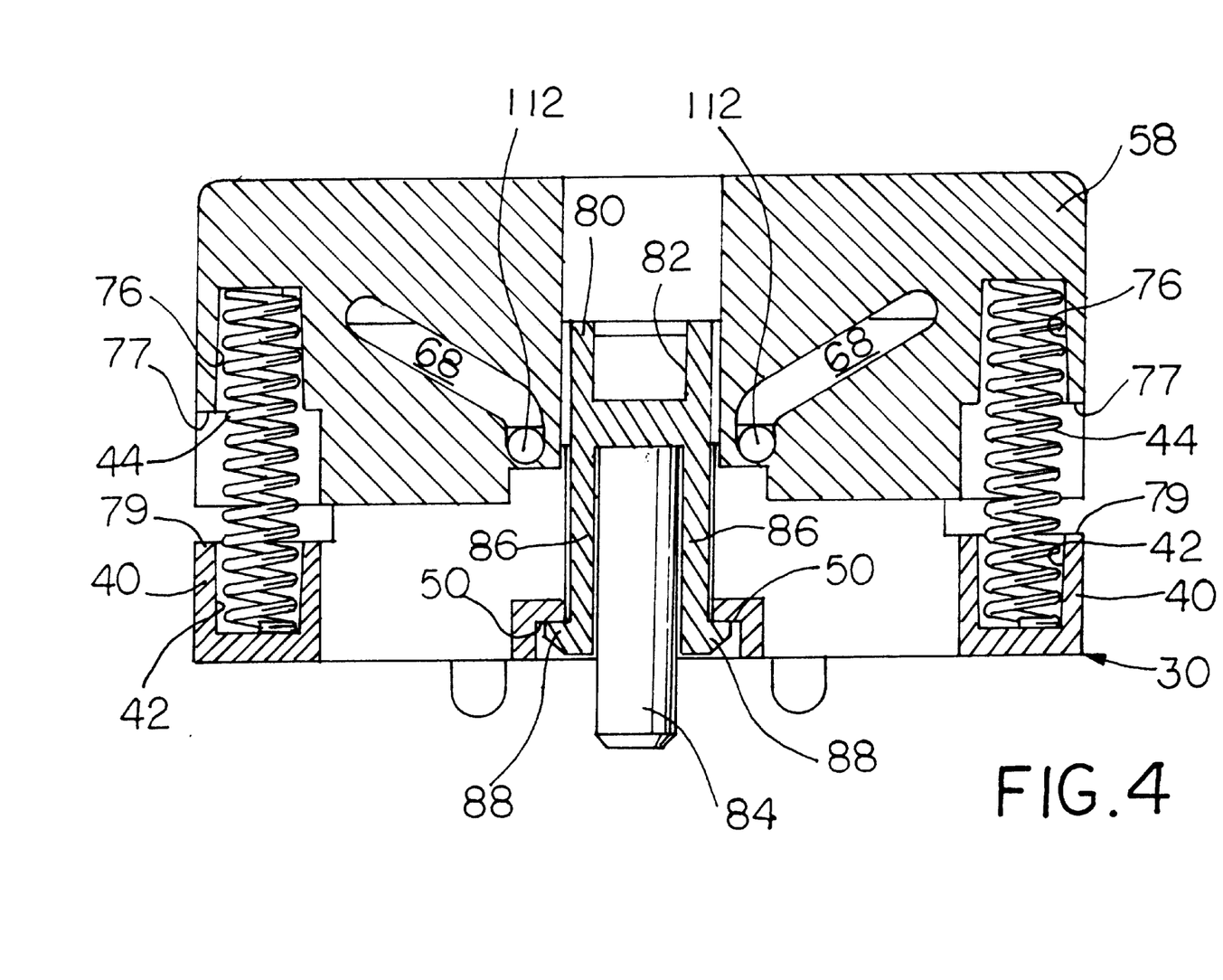
FIG. 4 is a view taken substantially along lines A—A of FIG. 3.
Figure 5:
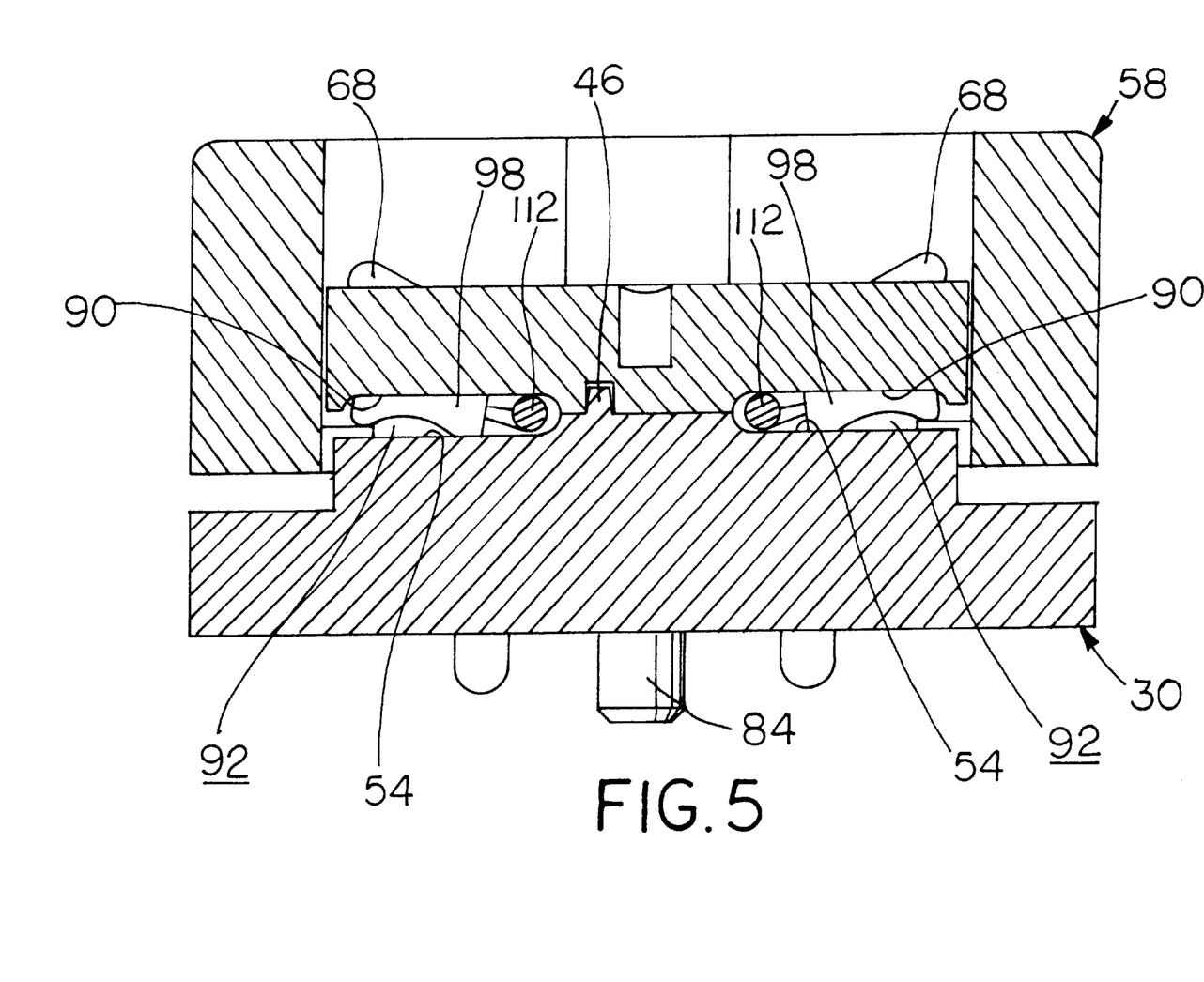
FIG. 5 is a view taken substantially along lines B—B of FIG. 3.
Figure 7:
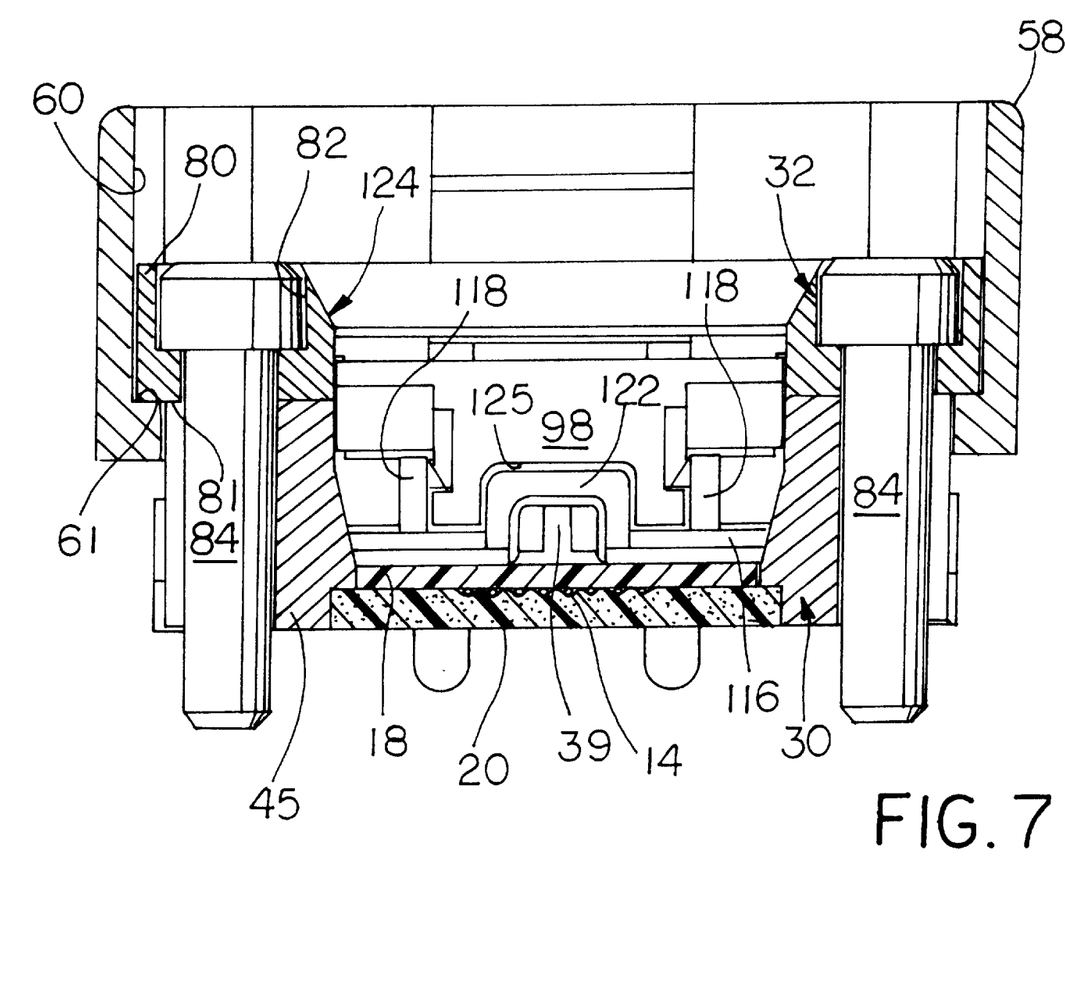
FIG. 7 is a view taken substantially along lines D—D of FIG. 3.

The lower base plate 30 and upper base plate 32 slidably support a camming member generally indicated by the numeral 56. Camming member 56 includes opposite walls 58 both of which include recessed portions 60 into which the columns 45 project. Shoulder 61 projects into the recesses 60 adjacent the lower end thereof. Walls 58 further include inner sliding surfaces 66 which slide against corresponding sliding surfaces 52. Angled camming slots 68 are provided in each of the surfaces 66. The walls 58 are interconnected by side walls 70. A recess 72 is defined in each of the side walls 70 and a control surface 74 defines the lower edge of each of the recesses 72. The control surface 74 will be described in detail hereinafter. The juncture of the corners between the walls 58 and 70 are provided with bores 76 which receive the ends of the springs 44 opposite the end received in the bores 42. The ends of the bores 76 define stop surfaces 77 (FIGS. 1 and 4) which engage corresponding stop surfaces 79 on columns 40 to stop downward movement of the camming member 58 when the camming member 58 is moved into the fully lowered position. Accordingly, the springs 44 yieldably urge the camming member 56 away from the lower base plate 30. The upper base plate 32 include opposite walls 78 from which apertured tabs 80 project. Apertured tabs 80 define apertures 82, which receive fasteners 84. The fasteners 84 are used to secure the socket 10 to the PC board 24. A shoulder 81 (FIGS. 2 and 7) is defined on the lower ends of the tabs 80 and are engaged by shoulders 61 on camming member 58 to act as a stop for camming member 58 when springs 44 urge the camming member 58 to the uppermost position.

Legs 86 extends downwardly from the tabs 80 and terminate in barbs 88 which are adapted to engage shoulders 50 when the socket is assembled. The walls 78 include undercuts 90 on the lower edges thereof which cooperates with the surfaces 54 to define slots 92 when the upper base plate 32 is assembled onto the lower base plate 30. The upper base plate 32 further includes end walls 94 from which solid tabs 96 extend.

Figure 1:
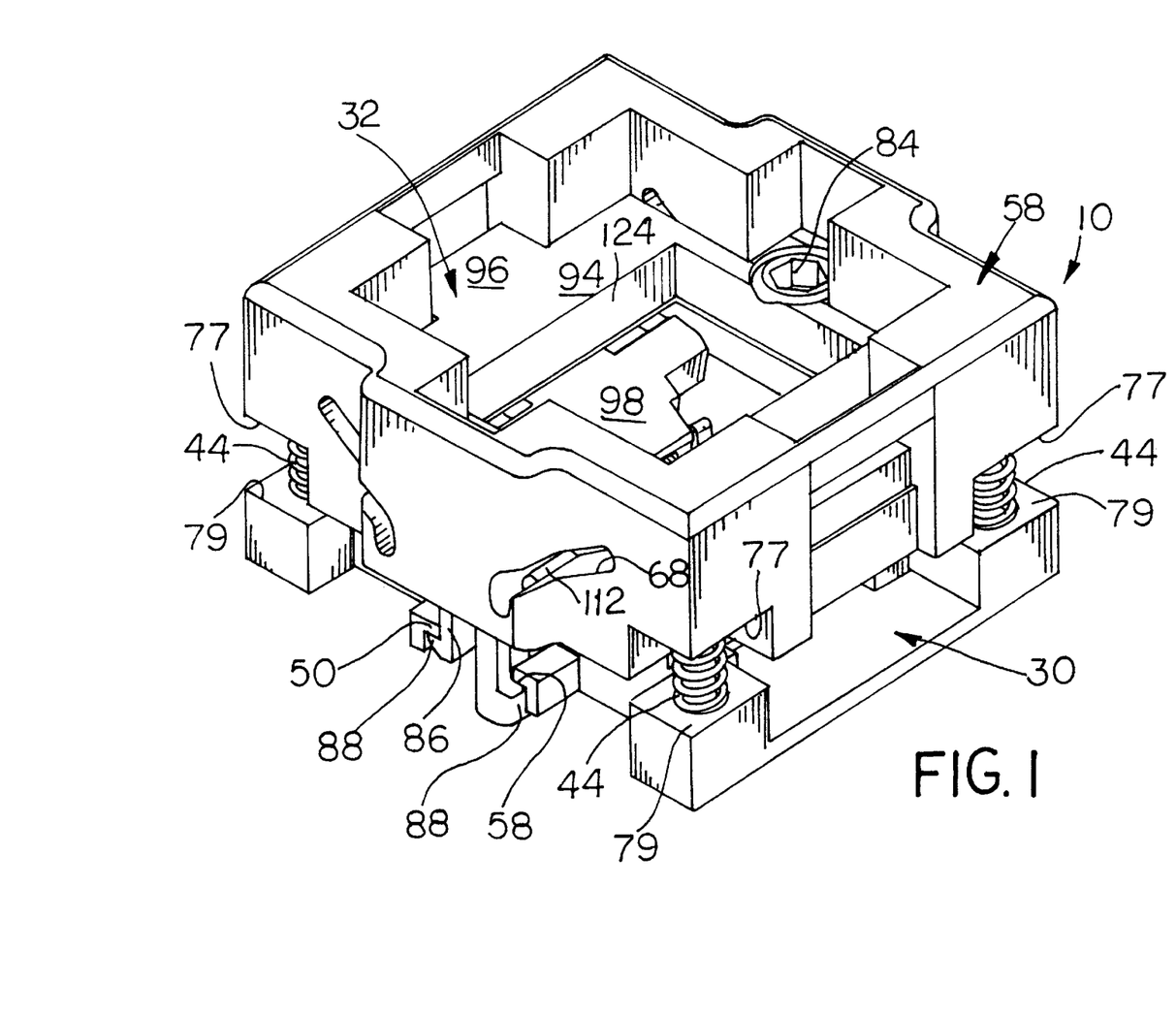
FIG. 1 is a view in perspective of a socket make pursuant to the teachings of the present invention.
Figure 2:
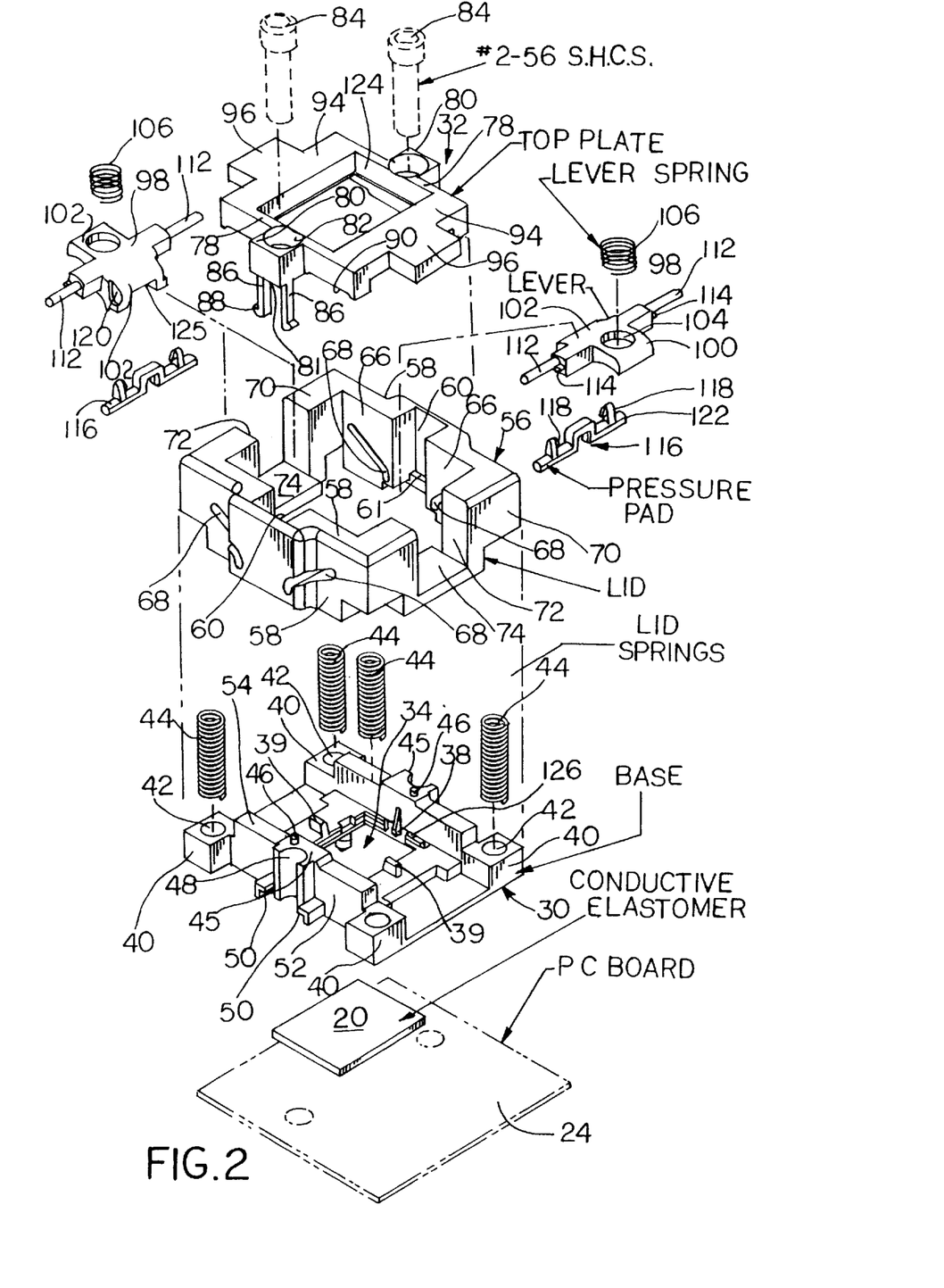
FIG. 2 is an exploded view in perspective of the socket illustrated in FIG. 1.
Figure 3:
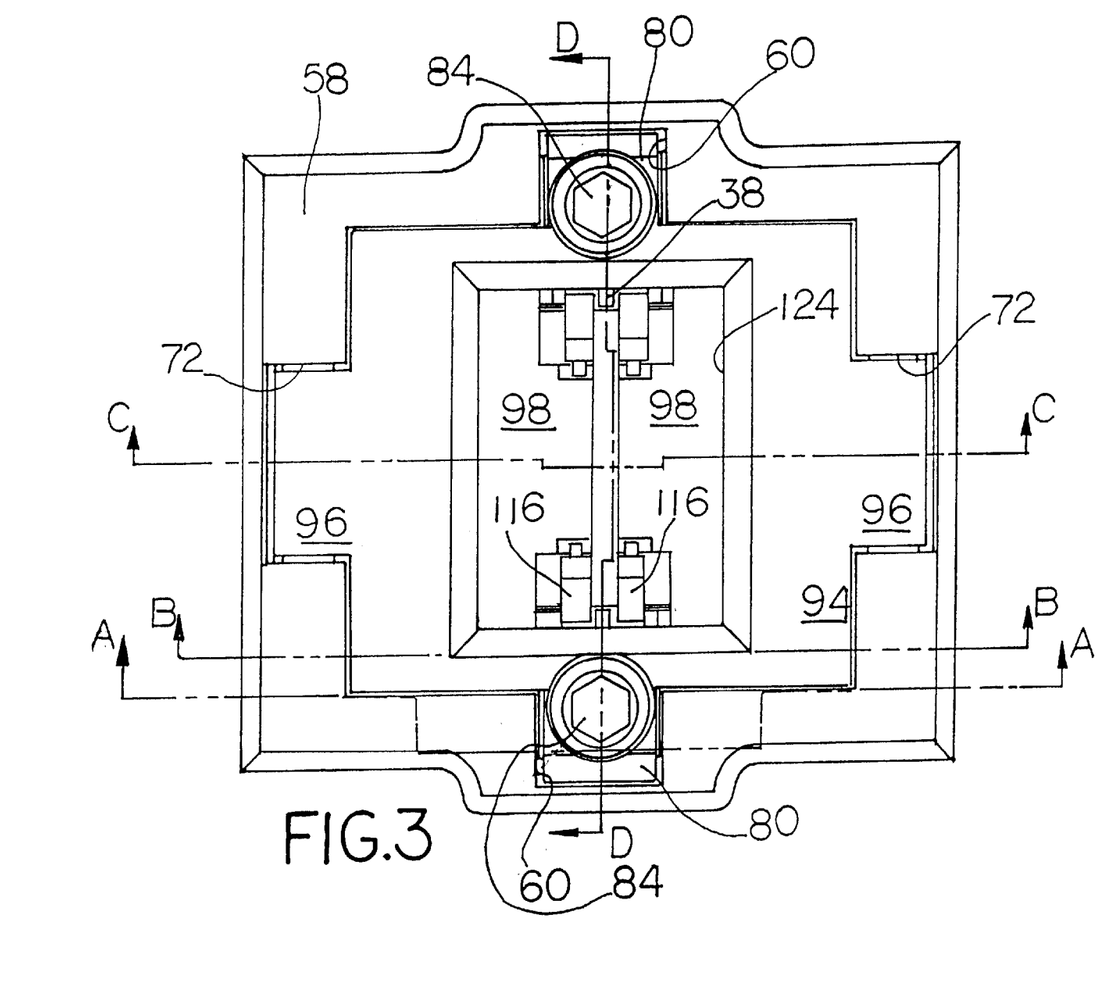
FIG. 3 is a top plan view of the socket illustrated in FIG. 1, the levers thereof being shown in the closed position in which the pressure pads carried by the levers engage the surface of the chip opposite the surface on which the terminal array is provided.

Tabs 80 are received within recess portion 60 on the camming member 56 and the legs 86 extends through the bottom of the recessed portion 60 substantially parallel to the columns 45 and the barbs 88 are engaged with the shoulders 50. Accordingly, the solid tabs 96 are received within the recesses 72 of the camming member 56. Accordingly, the upper base plate 32 and lower base plate 30 cooperate to guide the camming member 56 as it moves toward and away from the lower base plate 30. The camming member 56 is illustrated in FIG. 1 in its uppermost position, and is urged thereto by the action of the springs 44.

Figure 8:
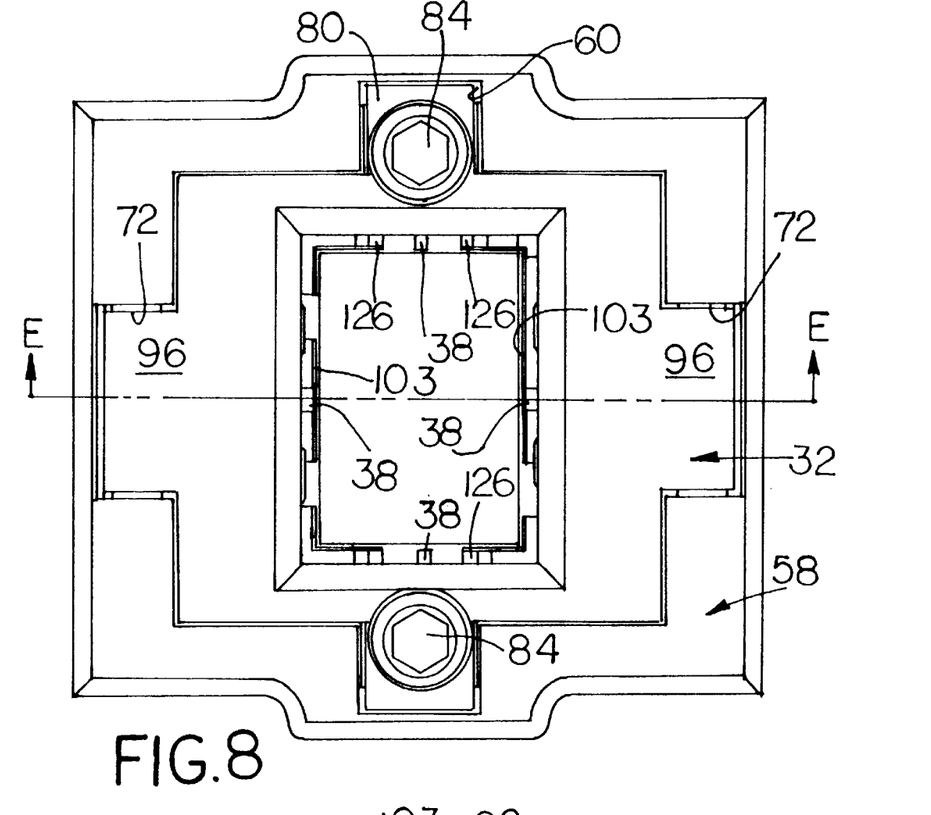
FIG. 8 is a top plan view similar to FIG. 3, but taken with the levers of the socket in the open position in which the pressure pads carried by the levers are disengaged from the chip.

A pair of levers 98 define opposite ends 100, 102. The ends 102 of each lever 98 define a surface 103 (FIGS. 8 and 9) which guide the chip 18 as it passes through the socket. A recess 104 is formed in the end 100 of each of the levers 98. One end of a coil spring 106 is received in the recess 104 of each lever 98, and the other end of the spring 106 slidably engages lower surface 108 of wall 94 of upper base plate 32. Ends 100 further include a curved surface 110 that slidably and pivotally engages the control surface 74 of camming member 56 as the latter moves from an intermediate position into its uppermost position illustrated in FIG. 1. Pins 112 extends from opposite edges of each of the levers 98 intermediate the ends 100, 102 thereof. Each of the pins 112 extends through a corresponding slot 92 and into a corresponding one of the camming slots 68 in the camming member 56. A detent 114 on each lever 98 acts as a stop wherein the springs 106 urge the detent 114 against surfaces 54 as the control surface 74 is moved away from the curved surface 110 on levers 98 as the camming member 56 is moved to the lowered position.

A pressure pad generally indicated by the numeral 116 is mounted on the ends 102 of the levers 98. Pressure pad 116 is adapted to engage the chip 18 as described hereinabove. Pressure pads 116 define a crown 117 (FIGS. 10–14) on one surface thereof and a flat surface 119 on the opposite surface. Pressure pads 116 further include hangers 118 that are pivotally received within recesses 120 to permit limited pivoting movement of the pad 116 with respect to the levers 98. Hangers 118 also permit movement of the levers 98 relative to pads 116 before pressure is applied through the pads 116 on the chip 18. Pads 116 further include a portion 122 that is designed to accommodate the projection 39 as the pressure pads are moved by the levers into engagement with the integrated circuit chip 18. The levers 98 include a recessed portion 125 to accommodate the portion 122.

In operation, the chip 18 is installed in the socket 10 by passing the chip through the opening 124 in upper base plate 32. The chip then passes between the ends 103 (FIG. 8) of the levers 98 and into the cavity 36. Accordingly, as the chip 18 passes through the socket and into the cavity 36, it passes through three different levels of alignment. The first level of alignment is provided by the opening 124; the second level of alignment is provided by the end surfaces 103 on the levers 98; and the final alignment is provided by the projections 38, 39. The springs 44 yieldably urge camming member 56 to its uppermost position illustrated in FIGS. 1–6. In this position, and referring to FIG. 4, the pins 112 are disposed in the lowermost portion of the camming slots 68. Springs 44, acting through camming member 56, pins 112, levers 98, slotsand 92, and pressure pads 116 provide the necessary inserting force such that the terminals 14 are embedded sufficiently in the elastomeric connection sheet 20 to assure that the terminals 14 make proper electric contact with the wire segments 22. The wire segments 22 are connected to an appropriate conductor (not shown) in the PC board 24. Accordingly, the appropriate test equipment (not shown) can be used to effect testing of the chip.

Figure 9:
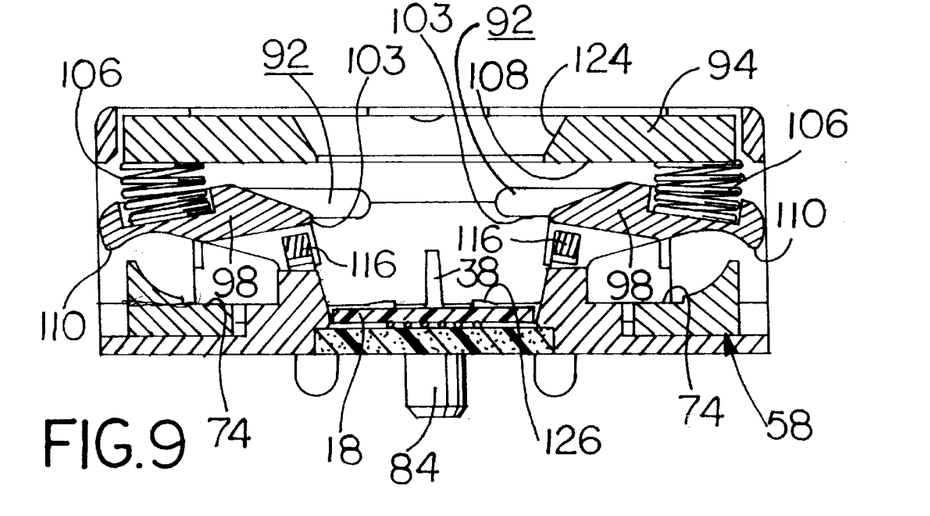
FIG. 9 is a cross sectional view taken substantially along lines E—E of FIG. 8.

After testing has been completed, the chip 26 is released by forcing the camming member 56 downwardly toward lower base plate 30. As the camming member 56 is lowered, springs 106 pivot the levers 98 about the pins 112 and about surfaces 110. Accordingly, the camming slots 68 force the pins 112 to move along the surfaces 54 toward the corresponding edges of the socket, thereby spreading the levers 98 away from each other. As the camming member 56 is moved downwardly, springs 106 maintain the surfaces 110 in sliding and pivoting engagement with the surfaces 74 until the camming member 56 is moved downwardly to an intermediate position between the fully raised position illustrated in FIG. 6 and the fully lowered position illustrated in FIG. 9. When this occurs, the detent or stop 114 on the levers 98 adjacent the pins 112 are urged into engagement with the sliding surface 54 by the springs 106, thereby preventing further downwardly pivoting movement of the levers 98 as the camming member 56 is lowered between the intermediate position and the fully lowered position illustrated in FIG. 9. As can be seen in FIG. 9, as the camming member 56 moves between the intermediate and the fully lowered position, the camming slots 68 continue to slide the levers 98 and their pins 112 along and relative to the sliding surface 54. As this occurs, the springs 106 also slide along the surfaces 108 until they attain the position illustrated in FIG. 9. When the camming member 56 is in its fully lowered position against the bias of springs 44 and the levers have been spread apart, the chip 16 can be extracted through the opening 124 in the upper base plate member 32, by any appropriate means, such as by vacuum extraction.

Figure 6:
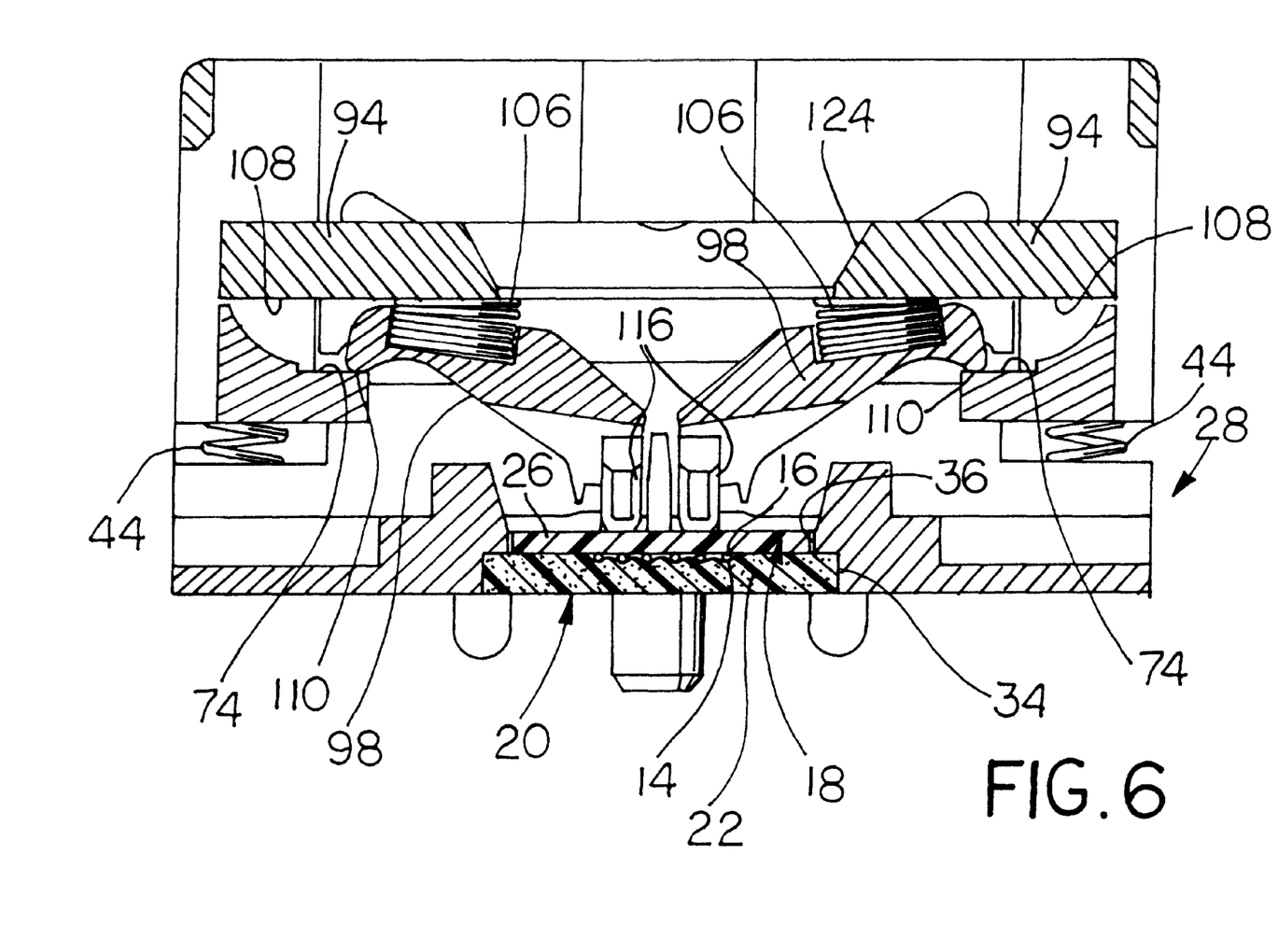
FIG. 6 is a view taken substantially along lines C—C of FIG. 3.
Figure 10:
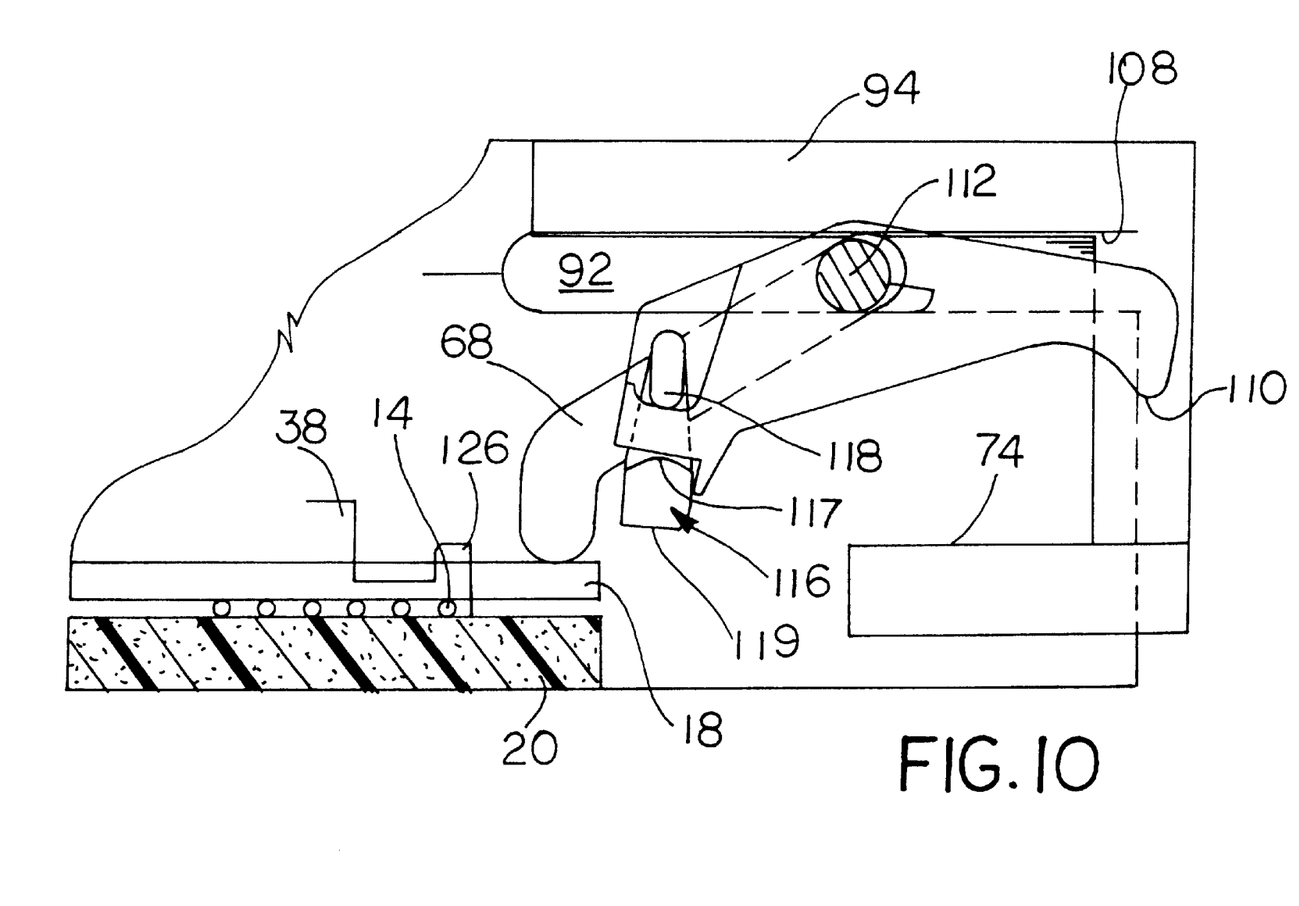
FIGS. 10–14 are large cross sectional views which schematically illustrate the manner in which the levers are moved from the open position displaced from the integrated circuit chip to the closed position in which the levers apply a force to the integrated circuit chip.
Figure 12:
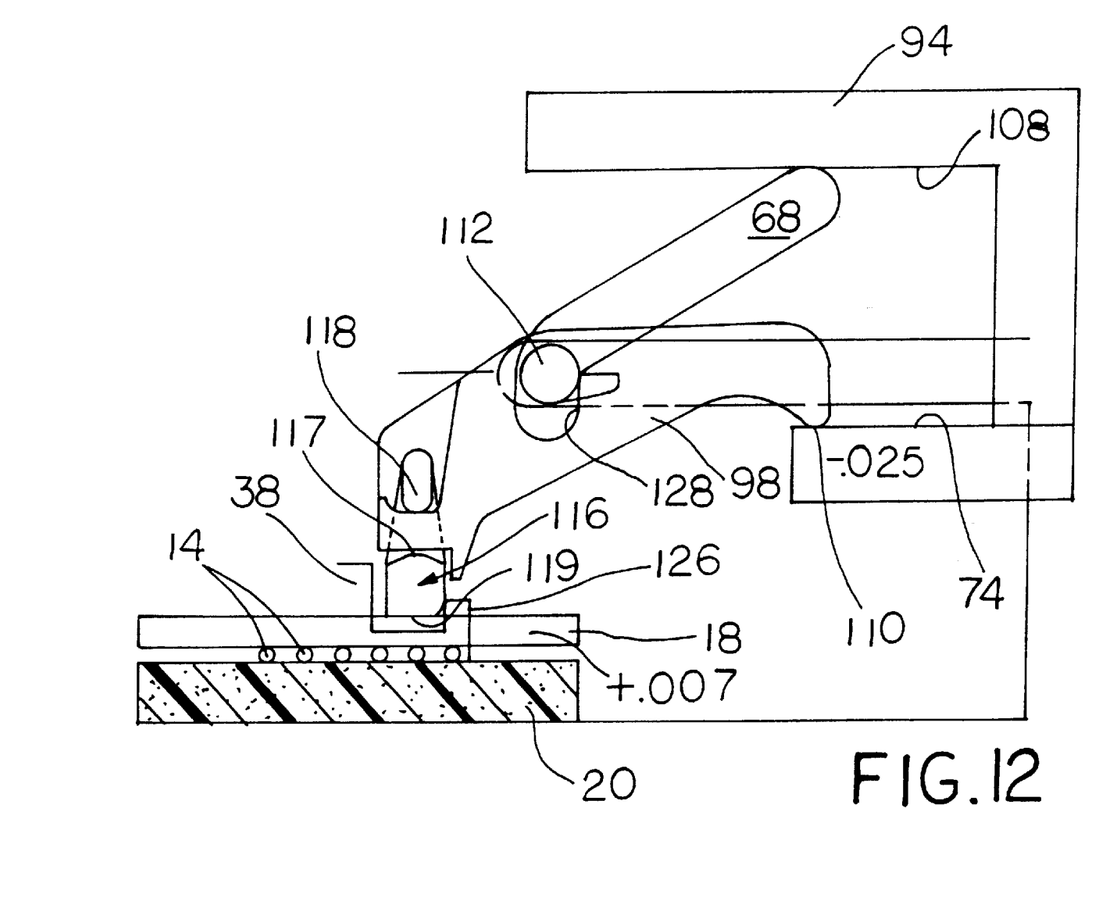
Figure 13:
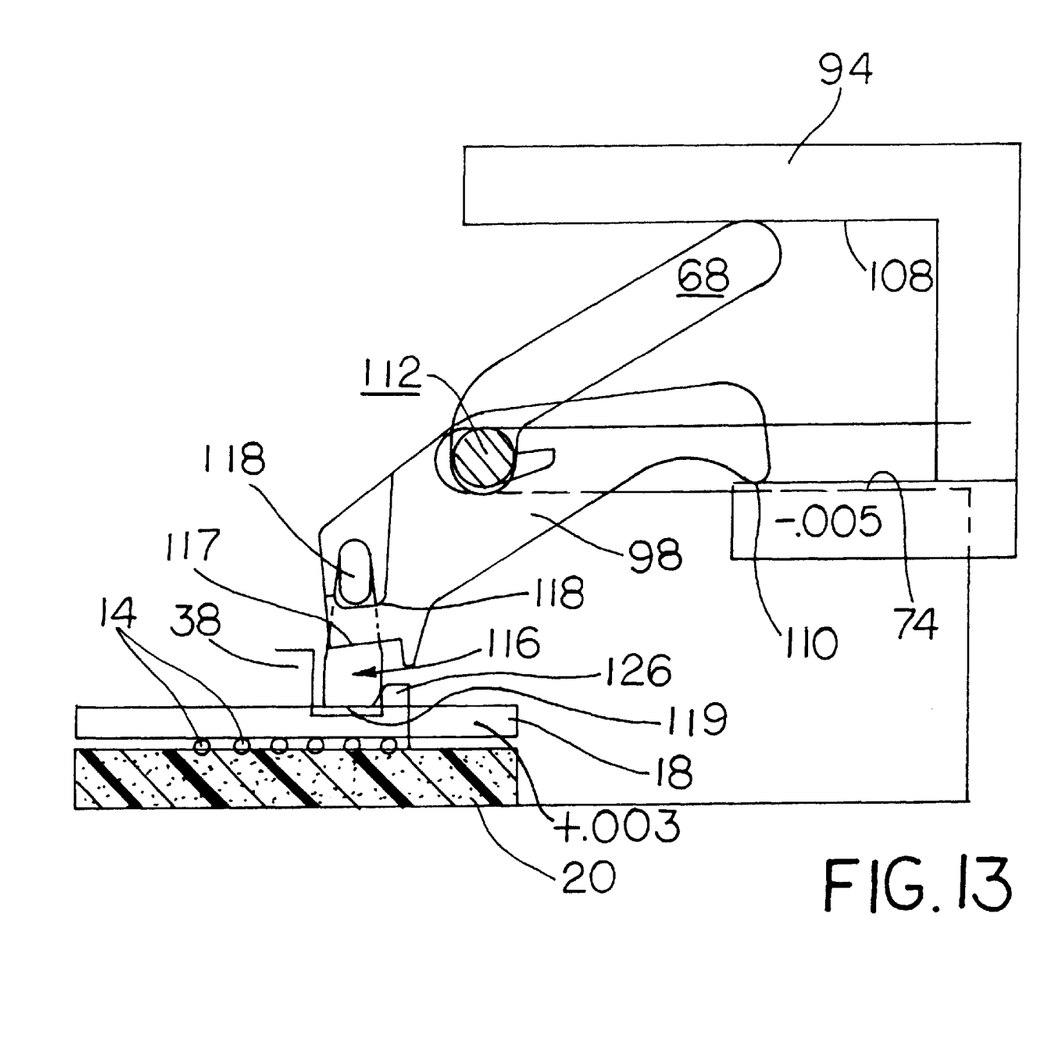
Figure 14:
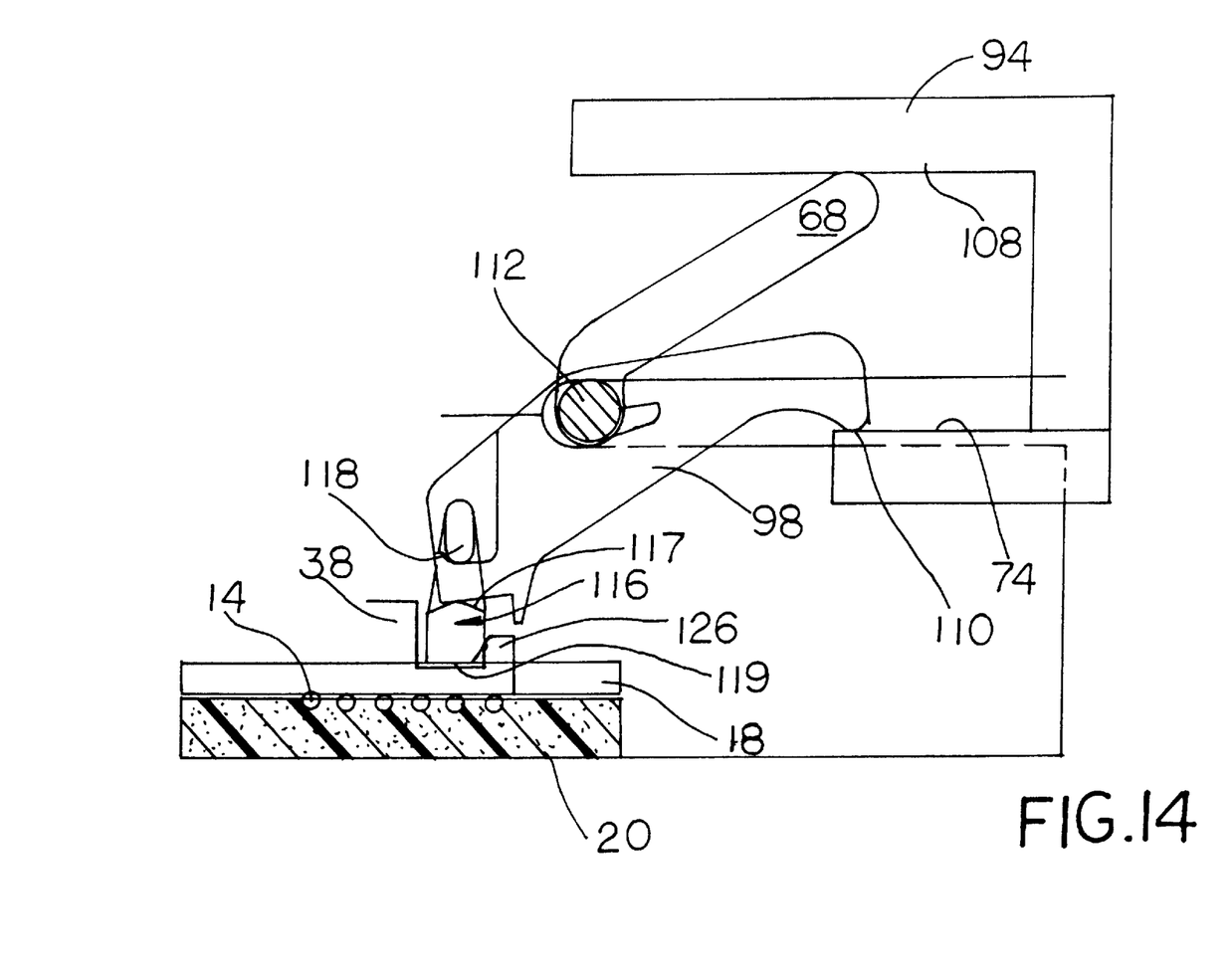

Referring now to FIGS. 10–14, which are schematic illustrations of the manner in which the levers 98 move the pressure pads 116 between the fully open position illustrated in FIGS. 9 and 10 and the fully closed position illustrated in FIGS. 6 and 14, FIG. 10 illustrates the various components of the socket 10 in a position in which they are disposed in when the camming member 56 is fully pressed against the force of the springs 44, and the levers are in the FIG. 9 position. The chip 18 has been inserted over the connecting sheet 20 by inserting the chip 18 through the opening 124 in upper base plate 32.

Figure 11:
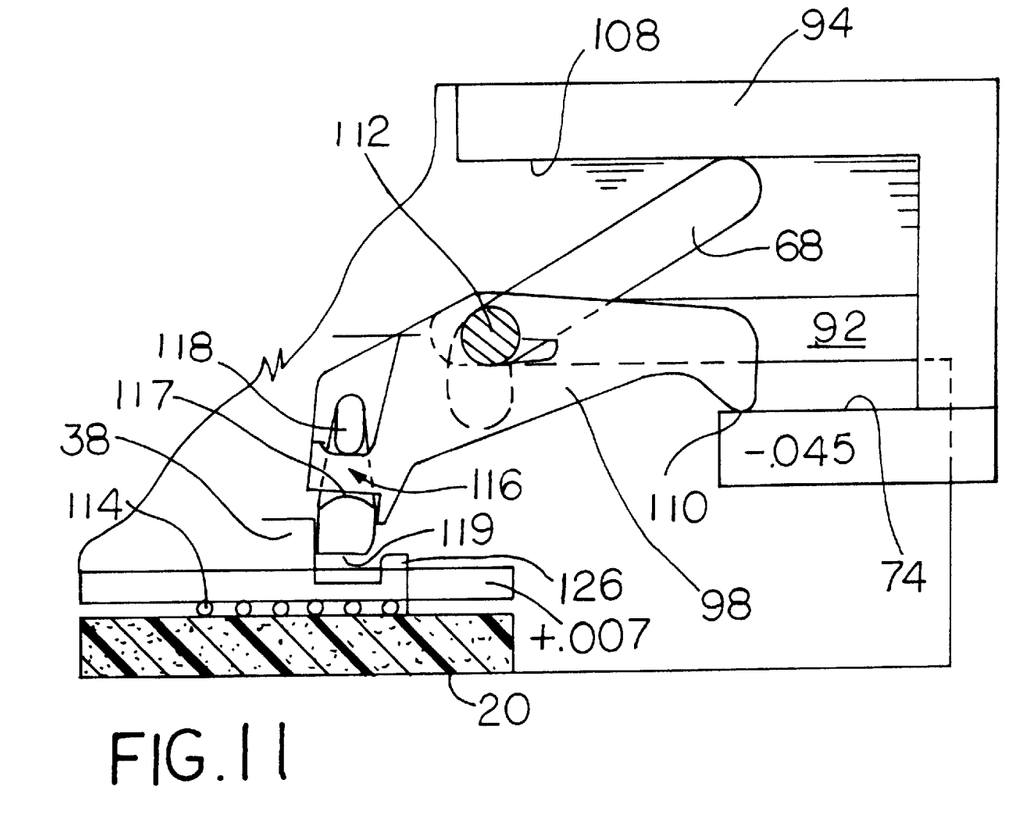

FIG. 11 illustrates the various components in the position which they assume when the camming member 56 is moved to the intermediate position, in which the control surface 74 engages the surface 110. In this position, the camming member 56 has been raised to a position in which the pins 112 have moved down the tapering portion of the camming slot 68, such that the pressure pads 116 are disposed over the chip 18. The pressure pads 116 are adapted to engage the projections 38 on the edge of the cavity 36. The projection 38 cooperates with a projection 126 adjacent thereto to guide the pad 116 in its proper orientation so that it properly engages the chip 18. As discussed above, the limited pivoting motion between the pad 116 and the lever 98 allows the pad 116 freedom to be guided by the projection 38 and 126. The projections 38 and 126 guide the pressure pad 116 to assure that the flat surface 119 will engage the chip 18 over the entire surface 119. The chip 18 is fragile, and point or line stresses on the chip 18 must be avoided. Because a clearance exists between the crown 117 and the lever 98, pivotal motion of the pad 116 is accommodated so that it may be guided by the projections 38 and 126. In FIG. 12, pressure pad 116 has just engaged the upper surface 26 of the chip 18 as the pivot pins 112 have just entered the vertical portion of the 128 of the slot 68. In FIGS. 13 and 14, the pressure pads 116 install the chip on the connector sheet such that the terminals are embedded in the connector sheet to their proper depth. Accordingly, surface 119 of pressure pad 116 has engaged the chip 18 and the clearance between the crown 117 and the lever 98 has been taken up, so that pressure may be applied to the chip 18 by the lever 98 through the pressure pad 116. In FIG. 14, the fully engaged position, the pressure is being fully applied to the chip 18 through the pressure pad 116. Accordingly, the terminals will be embedded in the connecting sheets 20 to the proper depth to assure good electrical contact with the wire segments.

What is claimed is:

1. Chip carrier socket for interconnecting an integrated circuit chip on a printed circuit board, said socket comprising a base portion having a chip receiving nest for positioning said chip in alignment with said printed circuit board; a locking assembly including a camming member having cam slots, a first spring and two rotatable and laterally translatable locking members having connecting members receivable in said slots wherein said locking members span said chip receiving nest from opposite sides thereof, are movable towards and away from each other, and float relative to the camming member, said camming member being movable relative to said base portion so as to move the connecting members along said slots and impart movement of said locking member relative to said base between a closed position, where said locking member at least partly overlies the chip to engage a side of said chip opposite said one side, said first spring biasing said camming member and locking member into said closed position, to an open position disengaged from said chip and laterally clear of said nest; and an upper cover assembly which applies a spring pressure against said locking member.

2. The chip carrier socket as claimed in claim 1, wherein said locking members are a lever, said connecting members being pins extending from opposite sides of said levers to engage said slots whereby said lever pivots about said pins as the pins and the levers translates along said slots relative to the camming member.

3. The chip carrier socket as claimed in claim 1, wherein said upper cover assembly comprises an upper cover member fixed to said base, and a second spring between said locking member and said upper cover member.

4. Chip carrier socket for interconnecting an integrated circuit chip on a printed circuit board, said socket comprising a rectangular base portion which is mountable to a printed circuit board, having a central chip receiving nest for positioning said chip in alignment with said printed circuit board, said rectangular base portion including end walls and side walls, a locking assembly comprised of a camming member and two locking members which flank said chip receiving nest, and which are floatably mounted within said camming member, and an upper cover assembly having an upper cover member fixed to said base and a first spring between said locking member and said upper cover member, said upper cover assembly applies a spring pressure against said locking members, said camming member being movable and vertically spring loaded by a second spring to move relative to, and towards and away from, said base portion so as to impart movement of said locking members relative to said base between a closed position, where said locking member at least partly overlies the chip receiving nest, to impart a force on the chip, to an open position laterally towards said end walls, disengaged from said chip and clear of said nest.

5. The chip carrier socket of claim 4, wherein the locking member is rotatable and laterally translatable.

6. The chip carrier socket of claim 5, wherein said camming member includes cam slots for receiving said locking member.

7. The chip carrier socket of claim 4, wherein the camming member is slidably mounted on said base, and said locking member includes connecting members for movement relative to the base and the camming member, whereby movement of the camming member moves said locking member between the open and closed positions.

8. The chip carrier socket as claimed in claim 7, wherein said camming member includes cam slots receiving said connecting members whereby movement of the camming member relative to the base moves the connecting members along said slots.

9. The chip carrier socket as claimed in claim 8, further comprising a first spring biasing said camming member and locking member into the closed position.

10. The chip carrier socket as claimed in claim 9, wherein said locking member is a lever, said connecting members being pins extending from opposite sides of said lever to engage said slots whereby said lever pivots about said pins as the pins and the lever translates along said slot relative to the camming member.

11. Chip carrier socket for interconnecting an integrated circuit chip on a printed circuit board, said socket comprising a base portion having a chip receiving nest for positioning said chip in alignment with said printed circuit board, and a locking assembly comprised of at least one locking member in the form of a lever, a first spring member spring loading said lever in a closed position where said locking member at least partly overlies the chip to engage said chip, said socket further comprising a camming member and an upwardly facing control surface, defined by an inwardly directed peripheral lip of said camming member along which said lever translates, when said first spring is disengaged.

12. The chip carrier socket of claim 11, wherein said camming member further includes camming surfaces against which said lever is engaged, whereby said camming member is spring loaded upwardly causing said control surface to engage said lever causing said lever to be pivoted towards said nest into said closed position, and said camming member being movable downwardly, causing counter pivoting of said lever member, and translation of said lever along said control surface to said open position.

13. The chip carrier socket of claim 11, wherein said camming member imparts the spring load on said locking member.

14. The chip carrier socket of claim 13, wherein said camming member is vertically spring loadably movable relative to, and towards and away from, said base portion, said camming member including said control surface which engages a free end of said lever.

15. Socket for positioning and installing an integrated circuit chip on a printed circuit board, said integrated circuit chip having terminals extending from one side of the integrated circuit chip, said socket comprising a base having a recess receiving a conductive elastomer positioned on the printed circuit board, said conductive elastomer having conductors extending between a side facing said printed circuit board and contacting said board, and a top surface for contacting said chip, means on said base for orienting the chip over the recess to said conductive elastomer, an actuating member movable relative to said base between an open position disengaged from said chip and a closed position engaging a side of said chip opposite said one side, said actuating member having a detent wherein said detent engages said base as said actuating member is moved between the closed and open positions, and inserting means exerting a force acting through said chip by said actuating member when the actuating member is in the closed position, to embed said terminals in the elastomer to thereby provide an electrical connection between the terminals and the elastomer.

16. Socket as claimed in claim 15, wherein said inserting means includes a camming mechanism slidably mounted on said base, said actuating member including connecting members connecting the actuating member to the camming mechanism for movement relative to the base and the camming mechanism, whereby movement of the camming mechanism moves said actuating member between the open and closed positions.

17. Socket as claimed in claim 16, wherein said camming mechanism includes cam slots receiving said connecting members whereby movement of the camming mechanism relative to the base moves the connecting members along said slots.

18. Socket as claimed in claim 17, wherein said inserting means further includes a first spring biasing said camming mechanism to urge said actuating member into the closed position.

19. Socket as claimed in claim 18, wherein said inserting means includes a second spring between said actuating member and said base.

20. Socket as claimed in claim 19, wherein said actuating member is a lever, said connecting means being pins extending from opposite sides of said lever to engage said slots whereby said lever pivots about said pins as the pins and the lever move along said slot relative to the camming mechanism.

21. Socket as claimed in claim 20, wherein a pressure pad is mounted on said lever for movement relative to the lever, said pressure pad engaging said opposite side of said chip when the lever is moved into the closed position.

22. Socket as claimed in claim 20, wherein said camming mechanism includes a control surface and said lever including a pair of opposite ends with said pins extending from said lever intermediate said ends, one of said ends engaging said chip when the actuating member is in the closed position, the other end of said lever engaging said control surface.

23. Socket as claimed in claim 22, wherein said first spring yieldably urges said camming mechanism from an initial position in which said control surface is displaced from said other end of said lever to an intermediate position in which said control surface engages said other end of said lever and from said intermediate position to a final position in which said lever is moved to the closed position, said other end of said lever pivoting and sliding relative to said control surface as the first spring urges said camming mechanism from said intermediate position to the final position.

24. Socket as claimed in claim 22, wherein said inserting means includes a first spring yieldably urging said camming mechanism from an initial position in which said control surface is displaced from said other end of said actuating mechanism to an intermediate position in which said control surface engages said other end of said actuating mechanism and from said intermediate position to a final position in which said actuating mechanism is moved to the closed position, said other end of said lever pivoting and sliding relative to said control surface as the first spring urges said camming mechanism from said intermediate position to the final position.

25. Socket as claimed in claim 24, wherein said inserting means includes a second spring between said actuating member and said base.

26. Chip carrier socket for interconnecting an integrated circuit chip on a printed circuit board, said socket comprising a base portion having a chip receiving nest for positioning said chip in alignment with said printed circuit board, a locking assembly comprised of a camming member and at least one locking member, said camming member being biased by a first spring and movable relative to said base portion so as to impart movement of said locking member relative to said base between a closed position, where said locking member at least partly overlies the chip to engage a side of said chip opposite said one side, to an open position disengaged from said chip and laterally clear of said nest and an upper cover assembly including an upper cover member fixed to said base and a second spring between said locking member and said cover member, which applies a spring pressure against said locking member.

27. The chip carrier socket of claim 26, wherein the locking member is rotatable and laterally translatable.

28. The chip carrier socket of claim 27, wherein the locking member floats relative to the camming member.

29. The chip carrier socket of claim 28, wherein said camming member includes cam slots for receiving said locking member, and for floating movement therein.

30. The chip carrier socket of claim 29, comprised of two locking members, said locking members spanning said chip receiving nest from opposite sides thereof, and movable towards and away from each other.

31. The chip carrier socket of claim 26, wherein the camming member is slidably mounted on said base, and said locking member includes connecting members for movement relative to the base and the camming member, whereby movement of the camming member moves said locking member between the open and closed positions.

32. The chip carrier socket as claimed in claim 31, wherein said camming member includes cam slots receiving said connecting members whereby movement of the camming member relative to the base moves the connecting members along said slots.

33. The chip carrier socket as claimed in claim 32, further comprising a second spring biasing said camming member and locking member into the closed position.

34. The chip carrier socket as claimed in claim 33, wherein said locking member is a lever, said connecting members being pins extending from opposite sides of said lever to engage said slots whereby said lever pivots about said pins as the pins and the lever translates along said slot relative to the camming member.

35. Socket for positioning and installing an integrated circuit chip having terminals on one side thereof on a conductive elastomer, said socket comprising a base having a recess for receiving said elastomer, means on said base for orienting the chip over the recess, an inserting member movable relative to said base for engaging a side of said chip opposite said one side and exerting a force on said chip to embed said terminals in the elastomer, a camming mechanism is mounted on said base for moving said inserting member from an open position in which the inserting member is moved away from said chip to a closed position in which said inserting member exerts said force on the chip, wherein said camming mechanism including a yieldable member urging said camming mechanism relative to the base and a control surface for engaging said inserting member, said yieldable member urging said camming mechanism from an initial position in which said control surface is displaced from said inserting member to an intermediate position in which said control surface engages said inserting member and from said intermediate position to a final position in which said inserting member exerts said force on said chip.

36. Socket as claimed in claim 35, wherein said camming mechanism includes camming slots receiving followers extending from said inserting member for guiding said inserting member between an open position in which the inserting member is moved away from said chip to a closed position in which said inserting member exerts said force on said chip.

37. Socket as claimed in claim 35, wherein said inserting member includes a lever movably mounted on said base and movable from a closed position in which the lever engages the chip and an open position permitting the chip to be installed in the socket through an opening in the base, said means orienting the chip including said opening, edges defined on said lever guiding said chip through said socket when the lever is in the open position, and projections engaging the chip when the latter is received over the recess.

* * * * *